(12) United States Patent
Faillon et al.

(10) Patent No.: US 6,768,266 B2
(45) Date of Patent: Jul. 27, 2004

(54) MICROWAVE PULSE GENERATOR INCORPORATING A PULSE COMPRESSOR

(75) Inventors: Georges Faillon, Meudon (FR); Alain-Joseph Durand, Velizy Villacoublay (FR)

(73) Assignee: Thales Electron Devices S.A., Velizy (FR)

( * ) Notice: Subject to any disclaimer, the term of this patent is extended or adjusted under 35 U.S.C. 154(b) by 204 days.

(21) Appl. No.: 10/148,901

(22) PCT Filed: Dec. 28, 2000

(86) PCT No.: PCT/FR00/03721
§ 371 (c)(1),
(2), (4) Date: Jun. 19, 2002

(87) PCT Pub. No.: WO01/50592
PCT Pub. Date: Jul. 12, 2001

(65) Prior Publication Data
US 2002/0180275 A1 Dec. 5, 2002

(30) Foreign Application Priority Data
Dec. 30, 1999 (FR) ............................................ 99 16776

(51) Int. Cl.[7] .......................... H01J 25/02; H01J 23/26
(52) U.S. Cl. .................... 315/5.38; 315/5.39; 315/5.37; 331/101; 331/107
(58) Field of Search ................................ 315/5.35, 5.36, 315/5.37, 5.38, 5.39, 5.43; 313/153, 293; 331/101, 107

(56) References Cited

U.S. PATENT DOCUMENTS

| | | | |
|---|---|---|---|
| 2,903,652 A | 9/1959 | Goldstein | |
| 3,435,342 A * | 3/1969 | Burnsweig, Jr. et al. | .... 375/308 |
| 3,600,705 A * | 8/1971 | Tantraporn et al. | ..... 331/107 G |
| 4,053,854 A * | 10/1977 | Havens | ........................ 331/101 |
| 4,243,961 A | 1/1981 | Faillon et al. | |
| 4,477,746 A * | 10/1984 | Piltch | .......................... 315/39 |
| 4,591,799 A | 5/1986 | Faillon et al. | |
| 4,730,169 A | 3/1988 | Li | |
| 4,733,131 A | 3/1988 | Tran et al. | |
| 4,749,906 A | 6/1988 | Tran et al. | |
| 4,827,192 A | 5/1989 | Tran et al. | |
| 4,933,594 A | 6/1990 | Faillon et al. | |
| 5,043,630 A | 8/1991 | Faillon et al. | |
| 5,072,202 A | 12/1991 | Tikes et al. | |
| 5,103,187 A | 4/1992 | Durand et al. | |
| 5,109,179 A | 4/1992 | Faillon et al. | |
| 5,225,739 A | 7/1993 | Faillon et al. | |
| 5,698,949 A | 12/1997 | Lien | |
| 5,838,107 A | 11/1998 | Beunas et al. | |
| 5,859,498 A | 1/1999 | Durand et al. | |
| 6,025,678 A * | 2/2000 | Faillon et al. | ................. 315/5 |
| 6,147,447 A | 11/2000 | Beunas et al. | |
| 6,486,605 B1 | 11/2002 | Beunas et al. | |

\* cited by examiner

*Primary Examiner*—Rajnikant B Patel
(74) *Attorney, Agent, or Firm*—Oblon, Spivak, McClelland, Maier & Neustadt, P.C.

(57) ABSTRACT

A pulse generator includes a microwave source that delivers a pulsed signal into a resonant compression cavity equipped with a switching device for opening or closing the resonant compression cavity. The pulsed signal is stored in the resonant compression cavity when closed to be compressed therein before being delivered with a greater amplitude and a smaller width when the resonant compression cavity is open. The microwave source is of the amplifier type with an instantaneous bandwidth including the resonant frequency of the resonant compression cavity. The microwave source receives, at an input, an input signal to be amplified that is taken from the resonant compression cavity. Such a pulse generator can find particular application in high-power pulse generators.

18 Claims, 5 Drawing Sheets

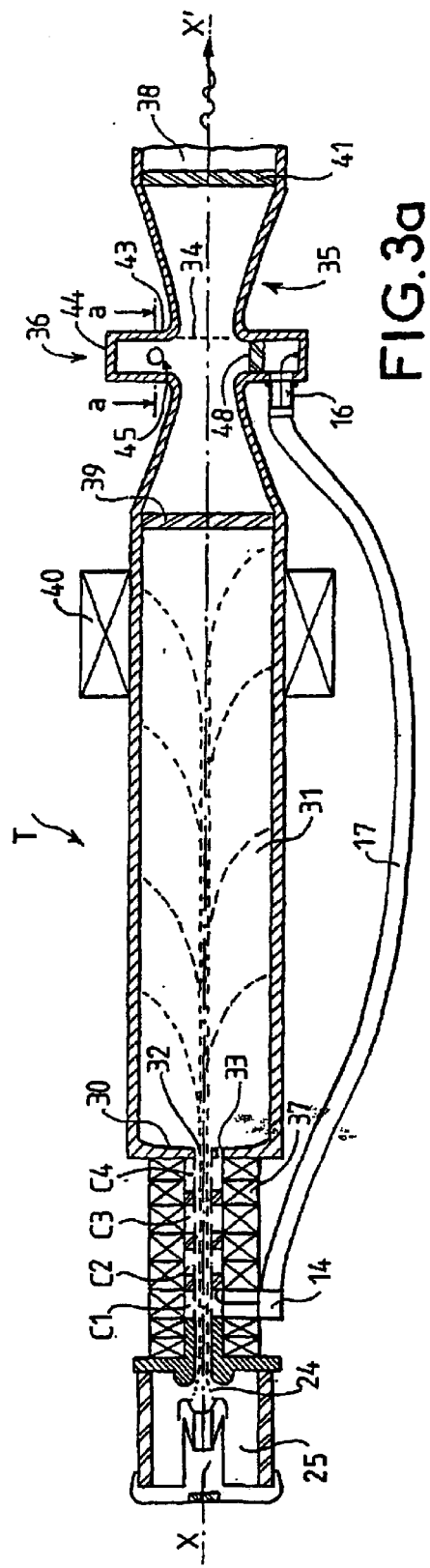
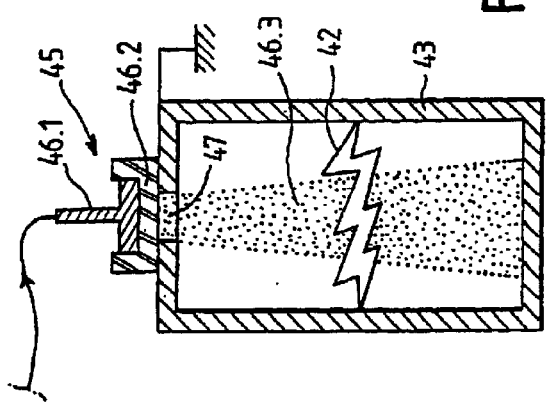

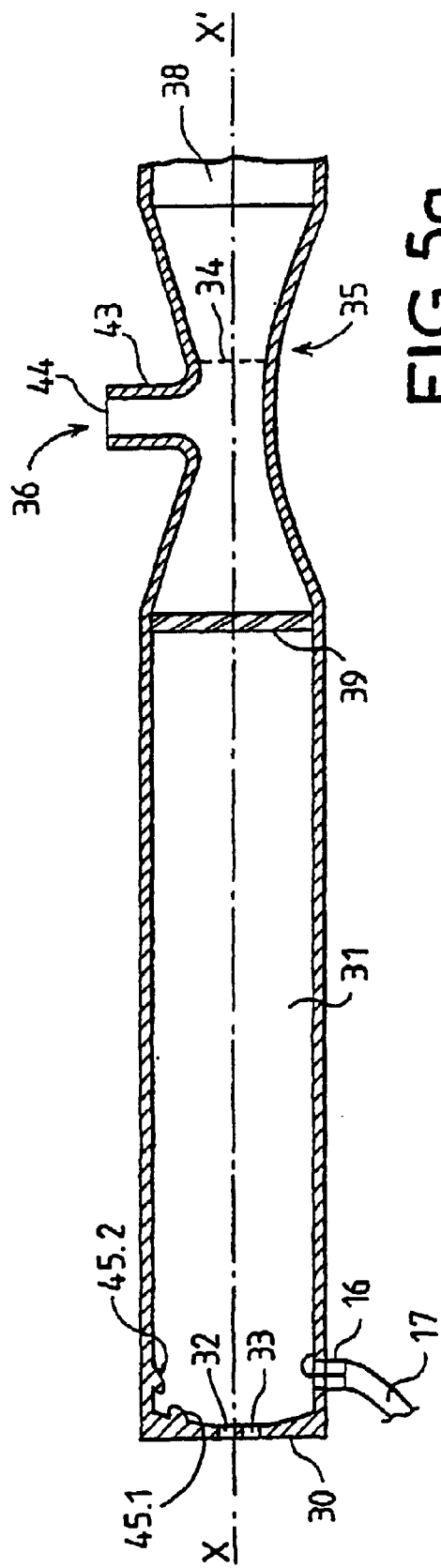
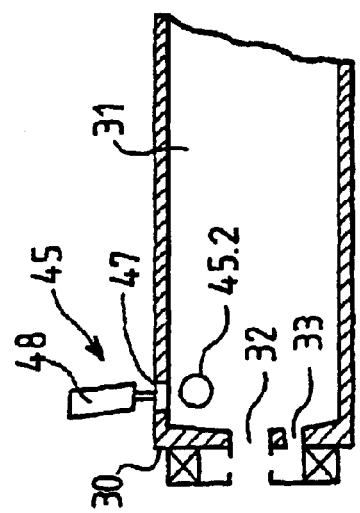
FIG.5a
FIG.5b

MICROWAVE PULSE GENERATOR INCORPORATING A PULSE COMPRESSOR

FIELD OF THE INVENTION

The present invention relates to microwave pulse generators capable of providing very high power pulses. This type of generator is applicable especially in the field of radar and scientific or industrial instruments such as electron accelerators, for example.

In these fields, it is sometimes sought to obtain narrow pulses of a few nanoseconds with a repetition frequency of one or more hundred Hertz. The peak output powers are of the order of a megawatt up to a hundred or so megawatts in the S band or in the X band. Of course, it is also sought to reduce the size of the generator as much as possible so that its diameter does not exceed about 10 centimeters and its length 1 meter to 1.5 meters.

BACKGROUND ART

Reference may be made to FIG. 1a. The microwave pulse generators which come closest to providing the required electrical performance comprise a magnetron 1 generating pulses and this magnetron 1 cooperates with a resonant compression cavity 2 in order to compress the pulse delivered so as to reach the desired peak power and pulse width. While the magnetron 1 emits a pulse of power P1 and of length t1, the resonant compression cavity 2 is closed, thereafter, it is open so as to be emptied quickly in a time t2 which is less than t1, into a user device 9, for example an emitting antenna shown diagrammatically by a horn. The closing and opening take place in a region of the cavity with the reference 6. At the output of the resonant compression cavity 2, except for losses, a pulse of power P2 is obtained such that $P2.t2 \cong P1.t1$, since there is conservation of energy.

FIG. 1b illustrates schematically the appearance of the pulse stored during the time t1 and that of the pulse released during the time t2.

The resonant cavity 2 can be opened and closed by means of an electric-arc switching device 3 possibly with an ionizable gas. The exemplary switching device 3 shown in FIG. 1a comprises an extension filled with an ionizable gas which is coupled to the resonant compression cavity 2, this extension has a bottom 4 acting as short circuit. Away from the bottom 4, a microwave window 8 separates the extension from the resonant compression cavity 2. The bottom 4 is separated, by a multiple h of a half wavelength $\lambda/2$ of the wave stored in the resonant compression cavity 2, from the region 6 of the resonant compression cavity 2. In the region 6, it restores a short circuit 5 which closes the resonant compression cavity 2. This extension comprises a device 7 which creates an electric arc, therefore a new short circuit 12, separated, by an odd multiple (2k+1) of a quarter wavelength $\lambda/4$, from the bottom 4. This short circuit 12 restores an open circuit, which opens the cavity into the user device 9, to the region 6.

The switching frequency corresponds to the desired repetition frequency and it is synchronized with a falling edge of the pulse to be compressed.

This type of pulse generator has the advantage of being simple and relatively compact, but has the major drawback of operating very poorly or not at all if the frequency of the magnetron 1 is not equal to the resonant frequency of the resonant compression cavity 2. This is because the resonant compression cavity 2 has a very high Q factor, for example about 10 000, in order to be able to store as much energy as possible. This value imposes, for example at 10 GHz, an accuracy of better than plus or minus 0.5 MHz on the frequency of the magnetron. Now, after transport and a dismantling-reassembly operation, during temperature variations, it is not unusual for the frequency of the magnetron to be offset by more than a megahertz.

The conventional solution is then to add a system 11 which searches for the resonant frequency of the resonant cavity and to automatically control the tuning system 10, which is generally motor operated, and which tunes the frequency of the magnetron 1 to this resonant frequency. However, the pulse generator then becomes heavy, larger and loses some of its simplicity. Also, if there is no search system, before each use, an adjustment has to be carried out which takes time and which is not compatible with the use that it is desired to make thereof under many circumstances.

SUMMARY OF THE INVENTION

The aim of the present invention is to overcome these frequency-adjustment and size problems.

In order to achieve this, the present invention proposes a pulse generator comprising a microwave source which delivers a pulsed signal into a resonant compression cavity equipped with a switching device for opening it or closing it, this pulsed signal being stored in the resonant compression cavity when closed in order to be compressed therein before being delivered with a greater amplitude and a smaller width when the cavity is open, characterized in that the microwave source is of the amplifier type with an instantaneous bandwidth including the resonant frequency of the resonant compression cavity, and in that it is fed an input signal to be amplified which is taken off from the resonant compression cavity.

With a structure of this sort, the frequency of the signal delivered by the microwave source is fully equal to the resonant frequency of the resonant compression cavity.

A solid-state amplifier or a longitudinal interaction microwave amplifier tube can be used as an amplifier.

The switching device may comprise a wall forming a short circuit which restores a short circuit in the resonant compression cavity in order to close it and means to strike an electric arc which restores an open circuit in place of the short circuit in order to open it.

The wall forming a short circuit may be the bottom of a waveguide portion connected to the resonant compression cavity.

The electric arc may be set up in the waveguide portion or else in the resonant compression cavity, which has the effect of changing its resonant frequency and of removing the closing short circuit.

The switching device may operate with an ionizable gas which facilitates the ignition of the electric arc.

The electric arc may be set up at bosses or points which have the effect of reinforcing the electric field wherever they are. It may also be set up in a small pressurized quartz tube which channels and optimizes the discharge.

The electric arc may be struck by radiation or may strike automatically when the electric field is sufficiently high.

When the microwave source is a microwave tube, in order to save on radial size, the resonant compression cavity may be made by its electron collector.

In this configuration, the collector is separated from the output cavity by a wall comprising a through-orifice for the electrons and a device for coupling the cavity to the collector which passes through the wall and which is distinct from the through-orifice for the electrons.

For the purpose of limiting the length of the collector, it is possible to equip the latter with deflection means in order to deflect the electrons in a suitable manner. The length traveled by the pulsed signal delivered by the microwave source up to the resonant compression cavity, in the resonant compression cavity then up to the microwave source and in the microwave source preferably introduces a phase shift which is a multiple of $2\pi$ at the resonant frequency of the compression cavity, so enabling the amplifier to be transformed into an oscillator.

Other features and advantages of the invention will become apparent on reading the following description illustrated by the appended figures which show:

BRIEF DESCRIPTION OF THE DRAWINGS

FIG. 3a, a second exemplary pulse generator according to the invention with a longitudinal interaction microwave tube as a microwave source and the electron collector of the tube as a resonant compression cavity;

FIG. 3b, in detail, the means to strike an electric arc in the switching device shown in FIG. 3a;

FIGS. 5a, 5b, two examples of means to strike an electric arc in order to change the resonant frequency of the compression cavity;

For the sake of clarity, the scales are not respected in these figures.

DESCRIPTION OF THE PREFERRED EMBODIMENT

Figure 2:
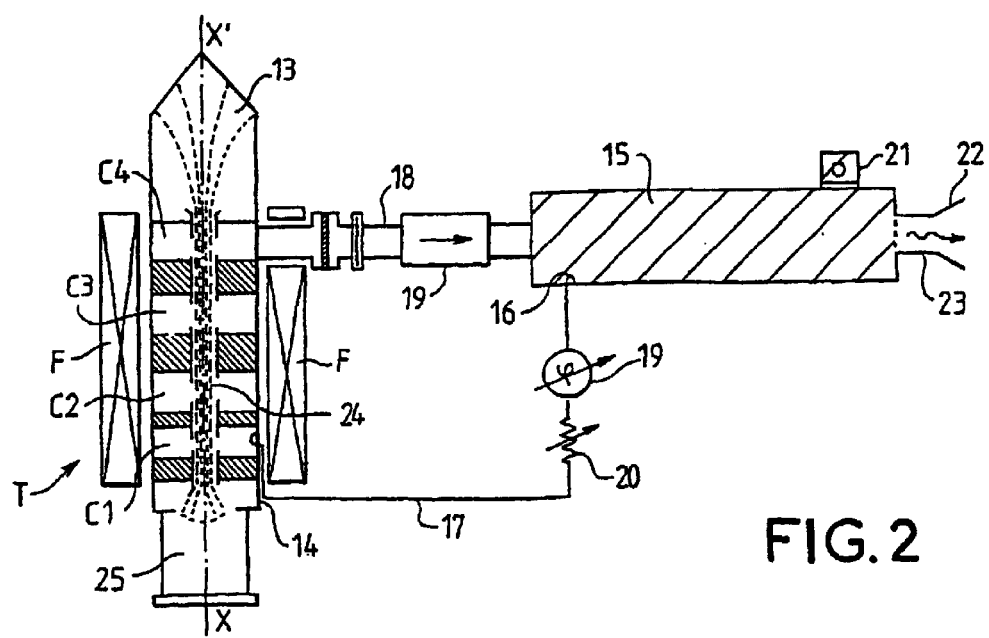
FIG. 2, a first example of a pulse generator according to the invention with a longitudinal interaction microwave tube as a microwave source.

Reference may be made to FIG. 2 which shows a pulse generator according to the invention with a longitudinal interaction microwave amplifier tube T, also known as type "O", as microwave source. In the figure, this is a klystron. It could be replaced by a traveling wave tube or any derivative of klystrons or of traveling wave tubes. This tube is conventional and comprises a gun 25 producing a long thin electron beam 24 along axis XX'. The electron beam 24 passes through a series of cavities C1 to C4. The cavities C1 to C4 are surrounded by a focusing device F. The cavity C1 closest to the gun 25 is called the input cavity. The cavity C4 furthest from the gun 25 is called the output cavity. The electrons of the beam 24, after having passed through the output cavity C4, are collected in a collector 13. A signal to be amplified is introduced into the input cavity C1 by means of a coupling device 14. It will interact with the electrons which will give up part of their energy to it. After amplification, the signal is extracted from the output cavity C4 and is injected into a resonant compression cavity 15.

According to one feature of the pulse generator according to the invention, the signal introduced into the input is taken off from the resonant compression cavity 15. To this end, means to take off the energy from the resonant compression cavity 15 in order to route it to the input have been shown, with: a coupling device 16, for example of the loop type, in the resonant compression cavity 15 and a transmission line 17 between the coupling device 16 which is immersed in the resonant compression cavity 15 and the coupling device 14 which is immersed in the input cavity C1.

Figure 1A:
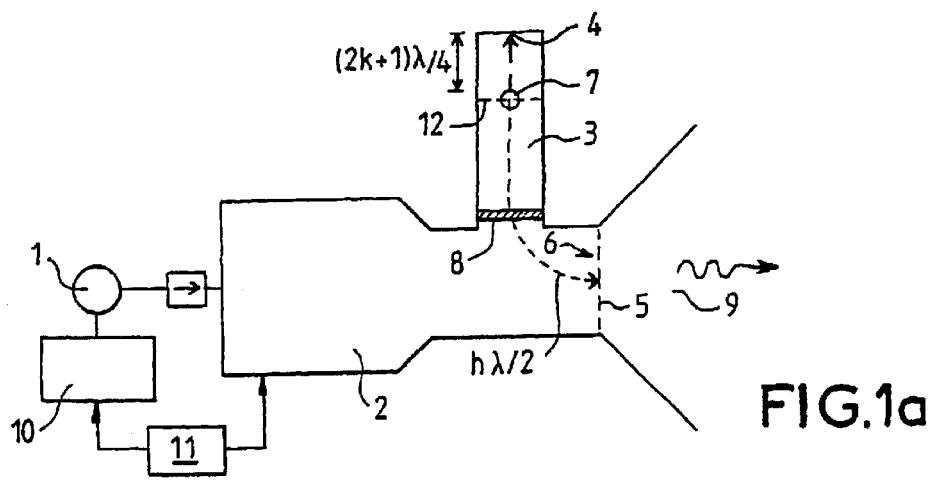
FIG. 1a, already described, a pulse generator of known type with a magnetron as a microwave source.

The resonant compression cavity 15 is equipped with a switching device 21 which may be of the same type as that described in FIG. 1a. Its operation is as follows: the resonant compression cavity 15 is closed by creating a short circuit while the energy is stored so as to be compressed, then the resonant compression cavity 15 is opened by creating a correctly positioned electric arc which changes the short circuit into an open circuit.

The resonant compression cavity 15 may or may not be directly connected to a user device 22, for example an antenna, close to the switching device 21. If this link is not direct, a transmission line 23 acts as an intermediary between the resonant compression cavity 15 and the user device 22.

The resonant compression cavity 15 is connected to the output cavity C4 by a transmission line 18, for example of the waveguide type. It is preferable, but not strictly necessary, to provide an isolator 19, for example a ferrite isolator, on this transmission line 18 in order to prevent waves being reflected from the resonant compression cavity 15 toward the microwave tube T.

By taking off the input signal from the resonant compression cavity 15, which has a high Q-factor and whose resonant frequency is fully defined by its dimensions, the frequency of the signal delivered by the microwave source is made to coincide with that of the resonant compression cavity. It is sufficient for the instantaneous bandwidth of the microwave source to encompass the resonant frequency. In order to optimize, especially with respect to gain, the performance of the microwave tube, it is possible to introduce a phase-shifting device 19 and/or an attenuating device 20 in the path between the resonant compression cavity 15 and the input cavity C1.

It would have been possible to envision that the electrical length of the closed loop formed by the microwave source T, by the transmission line 18 which connects the microwave source T to the resonant compression cavity 15, by the resonant compression cavity 15 and by the transmission line 17 which connects the resonant compression cavity 15 to the microwave source T introduces a phase shift which is a multiple of $2\pi$, at the operating frequency which is the resonant frequency of the resonant compression cavity, so that this unit behaves as an independent oscillator at this same frequency. In FIG. 3a, it is assumed that this is the case.

In order to save even more in terms of radial size, it is possible for it to be the collector 13 of the longitudinal interaction microwave tube T which acts as a resonant compression cavity. This variant is shown in FIG. 3a. The microwave tube T, in its part which goes from the gun 25 to the last but one cavity C3, is comparable to that shown in FIG. 2, except for the focusing device which has been adapted in order to further reduce the radial size, but which could have been retained.

The output cavity C4 located upstream of the collector 31 is separated therefrom by an end wall 30 provided with an orifice 32 for the electrons to pass through. These elements were not referenced in FIG. 2. On the other hand, the collector 31 and the output cavity C4 are now electromagnetically coupled to each other by means of a coupling member 33 which passes through the end wall 30 and is shown as an iris. The orifice 32 for the electrons to pass through is in the central part of the wall 30, set on the axis XX' of the electron beam 24 while the iris 33 is offset with respect to the axis XX'.

The pulsed microwave signal coming from the output cavity C4 is propagated in the collector 31 where, on the one hand, it coexists with the electrons of the beam 24 and, on the other hand, it is stored in order to be compressed therein. The output 35 of the collector 31 is located away from the end wall 30, and this output is made preferably longitudinally in order to reduce the radial size. The collector 31 is equipped with the switching device 36, the role of which is to ensure its closure, in the microwave sense of the term, during the phase of compressing the pulsed signal, and its opening during its extraction.

In order to keep as small a radial size as possible, the focusing device F of the tube T, which was outside in FIG. 2, has been replaced by a more compact device 37 housed between the cavities C1 to C4. It is made up of annular magnets. This device is known by the name "periodic permanent magnet" or "ppm" structure.

The collector 31 will be easily cooled by external radiation and convection since the mean power to be removed will be relatively small. With a peak microwave power of 1 MW and an efficiency of 40%, the power to be dissipated in the collector is about 1.75 kW with pulses at the input of 7 microseconds and at the output of 7 nanoseconds at the rate of 100 Hz. Now a cylindrical collector 75 millimeters in diameter and with a length of several tens of centimeters corresponds at worst to 10 W/cm$^2$. Removing such a power density does not pose any particular problem.

The microwave tube T operates under a vacuum and the user device 38 to which it is connected operates at a different pressure, for example at atmospheric pressure or a greater pressure. At least one window 39 is provided between the output cavity C4 and the user device 38. This window 39 will be placed as far as possible from the output cavity C4 so as to be exposed as little as possible to the electrons of the beam 24 which are dispersed in the collector 31. In FIG. 3a, the window 39 is placed at the end of the collector 31 just before the switching device 36. The length of the collector 31 is adapted so that it can accumulate all the microwave energy desired.

It is also possible to reduce the electron bombardment of the window 39 by placing deflection means 40 outside the collector 31 in order to deflect the electrons of the beam toward the walls of the collector 31 before they reach the window. These deflection means 40 may consist of one or more magnets with radial magnetization.

A second window 41 may be provided, placed between the switching device 36 and the user device 38 if the switching device 36 operates with an atmosphere which is different from that of the user device 38. A third window 48 has even been added in order to isolate the switching device 36 from the means to take the energy from the collector 31 (described below).

Various embodiments of the switching device 36 will now be seen. The switching frequency corresponds to the desired repetition frequency and, preferably, it is synchronized with a falling edge of the pulse to be compressed.

Figure 1B:
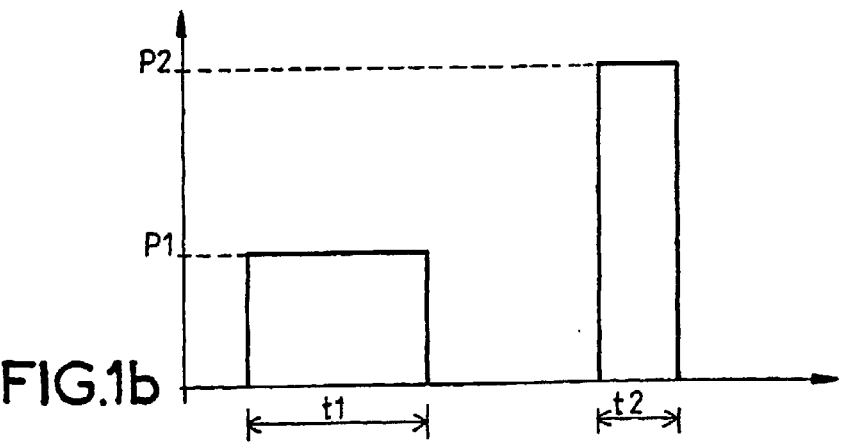
FIG. 1b, a representation in time of the power stored in the resonant compression cavity of FIG. 1a and of the power delivered after compression.

In a first variant shown in FIG. 3a, there is a device with an ionizable gas, like the one described in FIG. 1. The extension containing the ionizable gas is a waveguide portion 43 connected to the collector 31. Its bottom 44 restores the short circuit 34 at a whole number of half wavelengths in the collector 31 in order to close it. It contains means 45 to strike the electric arc 42 in the ionized gas and these means are outside the waveguide portion. The ionizable gas may be sulfur hexafluoride. This electric arc 42 is set up between two walls of the waveguide portion 43 and is equivalent to a short circuit. This electric arc 42 is set up at an odd number of quarter wavelengths from the bottom 44 in order to restore an open circuit in place of the short circuit 34.

The means 45 to strike the electric arc have been shown schematically in FIG. 3a by a circle but reference may be made to FIG. 3b in order to describe them in detail. The view of FIG. 3b is a cross section of the waveguide portion 43 along the line a—a. The arc is struck by the emission of radiation which causes ionization of the gas and, very quickly, the ignition of the arc 42 at the level of the radiation. In FIGS. 3a, 3b, the means 45 to strike the electric arc 42 are made up of an ultraviolet radiation emitter 46.3. The ultraviolet radiation 46.3 is emitted laterally in the waveguide portion 43 and the electric arc 42 is struck transversely to the ultraviolet radiation 46.3. This electric arc 42 corresponds to a discharge of the electric field component of the stored electromagnetic wave. This electric arc 42 forms the short circuit desired in order to open the collector 31. The radiation emitter may comprise an electrode 46.1 which is connected to an electrical generator (not shown) delivering a pulsed high voltage and a ceramic disk 46.2 held in a sandwich between one wall of the waveguide portion 43 and the electrode 46.1. The wall of the waveguide portion 43 comprises an opening closed off by a window 47 transparent to ultraviolet in order to allow the ultraviolet radiation 46.3 to enter into the waveguide portion 43. When the electrode 46.1 is powered, the ceramic disk 46.2 is brought to the potential of the electrode 46.1 on one side and to the potential of the wall of the waveguide portion on the other. Since these potentials are different, a breakdown of the ceramic disk 46.2 occurs together with emission of ultraviolet 46.3.

The dimensions of the waveguide portion 43 are matched to the microwave mode present in the collector 31. The geometry of the output 35 of the collector 31 is chosen in order to obtain, during the opening, the desired Q-factor in relation to the width t2 of the pulse delivered. To this end, the cross section of the collector has been reduced in the figures.

Figure 4A:
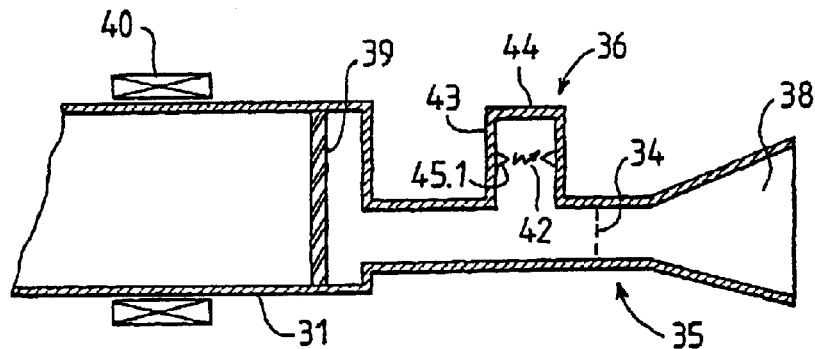
FIGS. 4a, 4b, 4c, various examples of switching devices for opening and closing the resonant compression cavity.
Figure 4B:
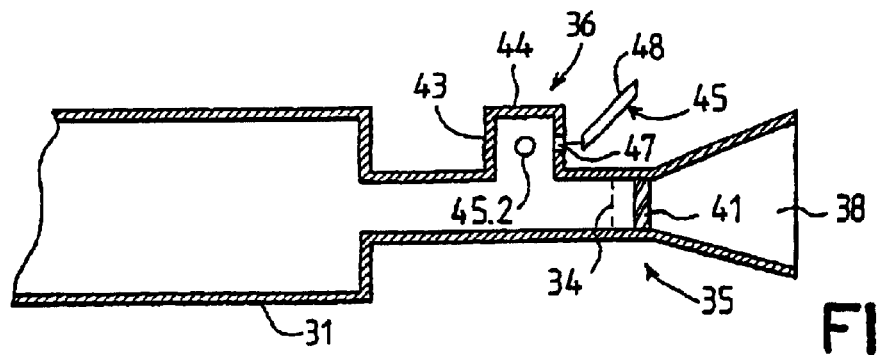

Instead of using a switching device with an ionizable gas, it is possible to use one thereof which operates in a vacuum like the collector, as shown in FIG. 4b or one which operates in the same atmosphere as the user device, as shown in FIG. 4a. It is enough to position the switching device 36 properly with respect to one or more windows.

Figure 4C:
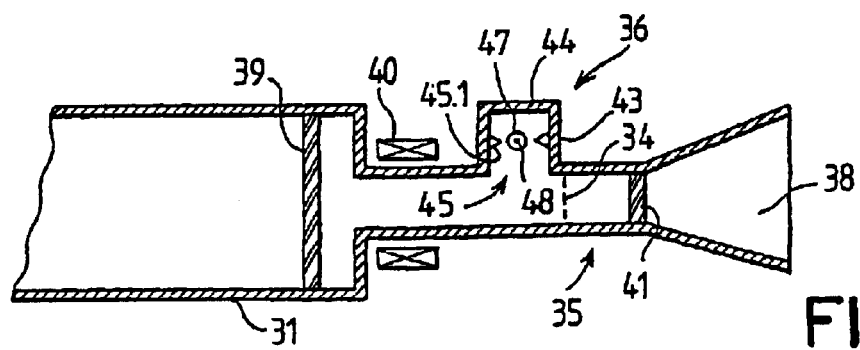

Instead of striking the electric arc 42 by means of the ultraviolet radiation, as shown in FIG. 3a, it is possible to use radiation of another type, delivered by a laser 48 for example, through a window 47 in order to ionize the gas (FIG. 4b, FIG. 4c).

At the location where the electric arc 42 will be set up, the waveguide portion 43 may internally comprise bosses or points 45.1 in order to reinforce the electric field, which facilitates ignition of the arc 42 (FIG. 4a, FIG. 4c).

The electric arc may be set up in a small specially pressurized quartz tube 45.2, placed in the waveguide portion 43, this arc being struck by radiation delivered, for example, by a laser 48 (FIG. 4b).

Other means can of course be envisioned in order to generate the electric arc without departing from the scope of the invention and in particular, the electric arc 42 may strike automatically when the electric field is sufficiently high (FIG. 4a). In this variant, the electric arc 42 is set up between the two bosses 45.1, which make it possible to position it.

Instead of the electric arc being ignited in the waveguide portion 43, whose bottom 44 restores a short circuit 34 which closes the collector 31, it is possible to ignite it at certain locations of the collector 31 considered suitable, depending on the microwave mode which is found therein and on the trajectory of the electrons. These locations are such that the electric arc 42, which starts therein, changes the resonant frequency in the collector 31 and removes the closure short circuit 34, the collector 31 is then changed into an open circuit. This variant is illustrated in FIGS. 5a and 5b. In FIG. 5a, the electric arc 42 is set up, by automatic striking, between two walls of the collector 31, placed substantially at right angles to each other, one of the walls being the wall 30 which separates the collector 31 from the output cavity C4. In FIG. 5b, a pressurized quartz tube 45.2, similar to that of FIG. 4b, has been placed substantially at the same location. The waveguide portion 43 is retained, its bottom 44 creating the closure short circuit 34.

Everything which has been described in order to close and open the collector may very well be applied to the case where the microwave energy is compressed in a resonant compression cavity different from the collector.

The means for taking off energy from the collector 31 and for transporting it for the purpose of injecting it to the input of the tube T are shown in the form of two loops 14 and 16, one 16 which is immersed in the collector 31 and the other 14 which is immersed in the input cavity C1 and these two loops 14, 16 are connected to each other by means of a transmission line 17. The means to take the energy from the collector will preferably be placed at a location where they afford the least possible disturbance. In FIG. 3a, they can be seen at the switching device 36 and in FIG. 5a, in the collector 31 close to the output cavity C4.

With such a structure, a pulse generator incorporating a klystron with a peak power of 50 to 100 kW in the X band, having the required electrical performance, could have a length of at most 80 centimeters for a diameter of at most 10 centimeters.

Figure 6:
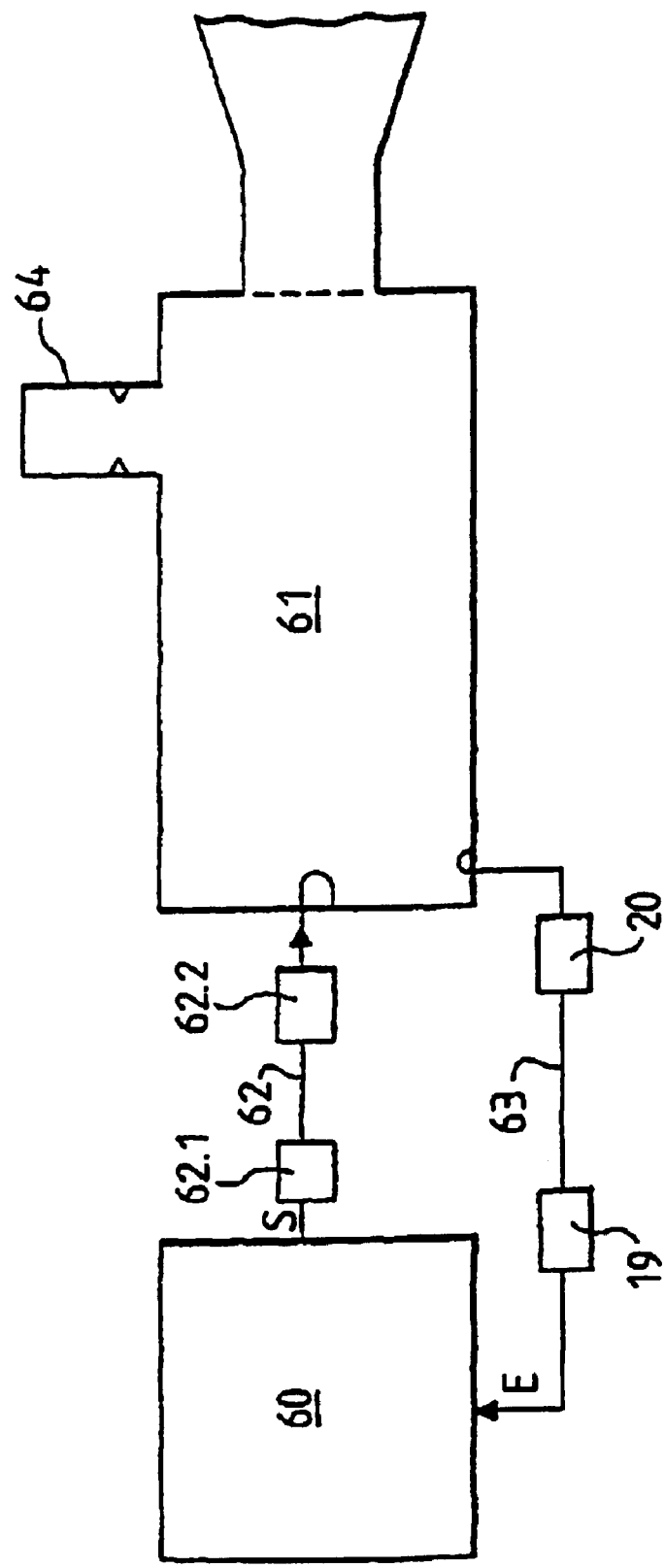
FIG. 6, another example of a pulse generator according to the invention with a solid-state amplifier as microwave source.

Instead of the amplifier being a tube amplifier, it can be a solid-state amplifier 60, as illustrated in FIG. 6. Its output S delivers a signal injected into the resonant compression cavity 61. A transmission line 62 transports it from the amplifier 60 to the resonant compression cavity 61. Energy is taken from the resonant compression cavity 61 in order to inject it into the input E of the amplifier 60. Another transmission line 63 transports it from the resonant compression cavity 61 to the input E of the amplifier 60. The compression cavity 61 is coupled to the switching device 64 which may take one of the embodiments described above. The transmission line 62 may possibly comprise an attenuation device 62.1 and/or an isolator 62.2 for the purposes of proper matching and protection. The line 63 may possibly comprise, as in FIG. 2, a phase shifting device 19 and/or an attenuation device 20.

What is claimed is:

1. A pulse generator comprising:
   a microwave source configured to deliver a pulsed signal into a resonant compression cavity equipped with a switching device for opening or closing the resonant compression cavity, the pulsed signal being stored in the resonant compression cavity when closed to be compressed therein before being delivered with a greater amplitude and a smaller width when the resonant compression cavity is open;
   wherein the microwave source comprises an amplifier with an instantaneous bandwidth including a resonant frequency of the resonant compression cavity, and
   wherein the microwave source is fed, at an input, an input signal to be amplified that is taken off from the resonant compression cavity.

2. The pulse generator as claimed in claim 1, wherein the microwave source comprises a solid-state amplifier.

3. The pulse generator as claimed in claim 1, wherein the microwave source comprises a longitudinal interaction microwave amplifier tube.

4. The pulse generator as claimed in claim 1, wherein the switching device comprises a wall forming a short circuit configured to restore a short circuit in the resonant compression cavity to close the resonant compression cavity and means for striking an electric arc that restores an open circuit in place of the short circuit to open the resonant compression cavity.

5. The pulse generator as claimed in claim 4, wherein the wall forming the short circuit is a bottom of a waveguide portion connected to the resonant compression cavity.

6. The pulse generator as claimed in claim 5, wherein the electric arc is set up in the waveguide portion.

7. The pulse generator as claimed in claim 4, wherein the electric arc is set up in the resonant compression cavity, to change its resonant frequency.

8. The pulse generator as claimed in claim 4, wherein the switching device operates with an ionizable gas.

9. The pulse generator as claimed in claim 4, wherein the electric arc is set up between two facing bosses.

10. The pulse generator as claimed in claim 4, wherein the electric arc is set up in a pressurized quartz tube.

11. The pulse generator as claimed in claim 4, wherein the means for striking the electric arc releases radiation.

12. The pulse generator as claimed in claim 4, wherein the electric arc strikes automatically.

13. The pulse generator as claimed in claim 3, wherein the microwave tube comprises an electron collector, and wherein the resonant compression cavity is made by the electron collector.

14. The pulse generator as claimed in claim 13, wherein the microwave tube comprises, upstream from the electron collector, an output cavity, wherein the electron collector is separated from the output cavity by a wall comprising a through-orifice for the electrons and a device for coupling the output cavity to the electron collector that passes through the wall and that is distinct from the through-orifice for the electrons.

15. The pulse generator as claimed in claim 13, wherein the electron collector is equipped with deflection means for deflecting electrons.

16. The pulse generator as claimed in claim 1, further comprising, between the resonant compression cavity and the microwave source, means for taking off the input signal to be amplified from the resonant compression cavity and injecting the input signal at the input of the microwave source.

17. The pulse generator as claimed in claim 16, wherein the means for taking off the input signal to be amplified from the resonant compression cavity and injecting the input signal at the input of the microwave source comprises at least one of a phase-shifting device and an attenuating device.

18. The pulse generator as claimed in claim 1, wherein a length traveled by the pulsed signal delivered by the microwave source up to the resonant compression cavity, in the resonant compression cavity up to the microwave source and in the microwave source, introduces a phase shift that is a multiple of $2\pi$ at the resonant frequency of the resonant compression cavity.

* * * * *